United States Patent [19]
Aumann

[11] 3,967,210
[45] June 29, 1976

[54] MULTIMODE AND MULTISTATE LADDER OSCILLATOR AND FREQUENCY RECOGNITION DEVICE

[75] Inventor: Herbert M. Aumann, Acton, Mass.

[73] Assignee: Wisconsin Alumni Research Foundation, Madison, Wis.

[22] Filed: Nov. 12, 1974

[21] Appl. No.: 523,054

[52] U.S. Cl. .................................. 331/56; 324/82; 331/132; 331/135; 333/80 R
[51] Int. Cl.[2] .................. H03B 7/00; H03B 25/00; G01R 23/18
[58] Field of Search ............ 331/56, 135, 136, 137, 331/107 T, 57, 60; 333/70 R, 80 R, 80 T; 324/82

[56] References Cited
UNITED STATES PATENTS

| | | | |
|---|---|---|---|
| 2,881,256 | 4/1959 | Plouffe, Jr. .......................... | 331/135 |
| 3,135,917 | 6/1964 | Best et al. .......................... | 333/70 R |
| 3,189,820 | 6/1965 | Lowman .............................. | 324/82 |
| 3,207,914 | 9/1965 | Mabuchi .......................... | 331/107 T |
| 3,354,408 | 11/1967 | Crowell................................ | 331/56 |
| 3,822,381 | 7/1974 | Scott.................................. | 331/107 |
| 3,824,496 | 7/1974 | Hekimian............................. | 331/135 |

OTHER PUBLICATIONS

Wave Filters, L. C. Jackson, Yr. 1950, pp. 8–9.
A. C. Scott, "The Distributed Tunnel Diode Oscillator," IEEE Transactions on Circuit Theory pp. 55–59, Mar. 1963.
A. C. Scott, "Distributed Multimode Oscillators of One and Two Spatial Dimensions," IEEE Transactions on Circuit Theory, pp. 55–60, Feb. 1970.
A. C. Scott, "Tunnel Diode Arrays for Information Processing and Storage," IEEE Transactions on Systems, Man and Cybernetics, vol. SMC-1, No. 3, pp. 267–275, July 1971.
H. M. Aumann, "Standing Waves on a Multimode Ladder Osc." IEE Trans. on Circuits and Systems, pp. 461, 462, May, 1974.

Primary Examiner—John Kominski
Attorney, Agent, or Firm—Isaksen, Werner, Lathrop & Heaney

[57] ABSTRACT

A ladder oscillator composed of capacitive and inductive impedances connected together to form a ladder network which has a chosen number N oscillation modes at N different frequencies. Each oscillation mode is characterized by a unique standing wave voltage pattern along the nodes of the ladder oscillator, with the mode in which the ladder oscillator is oscillating being determinable from the amplitudes or phase of the oscillations at the nodes. A logic circuit may be connected to the nodes of the oscillator to compare the phases of selected nodes and thereby determine which mode the oscillator is oscillating in. A ladder oscillator composed of passive capacitive and inductive impedances can be utilized as a frequency recognition device, since the passive ladder oscillator will display the characteristic standing wave patterns if an input signal impressed upon the ladder oscillator is close to one of the mode frequencies of the oscillator. A CL ladder oscillator having series capacitive impedances and shunt inductive impedances can exhibit sustained and autonomous oscillations if active nonlinear devices are connected in parallel with the shunt inductive impedances. The active CL ladder oscillator can be synchronized to input frequencies impressed upon the oscillator, and will continue to oscillate after the input signal has been removed at a mode frequency which is, in general, nearest to the input signal frequency. Autonomous oscillations may also be obtained as desired from the active CL ladder oscillator at the mode frequencies.

12 Claims, 9 Drawing Figures

MULTIMODE AND MULTISTATE LADDER OSCILLATOR AND FREQUENCY RECOGNITION DEVICE

The invention described herein was made in the performance of work under NASA Contract Number NGR-50-002-160 and is subject to the provisions of Section 305 of the National Aeronautics and Space Act of 1958 (72 Stat. 435; 42 U.S.C. 2457).

BACKGROUND OF THE INVENTION

1. Field of the Invention

This invention pertains generally to the field of oscillators and frequency recognition devices, and more particularly to such devices having multiple modes or frequencies of oscillation.

2. Description of the Prior Art

Standing waves on transmission lines are a well known phenomena, with the number of the standing waves present, and the frequency of the standing wave being related to the length of the transmission line and the inductance and capacitance of the line. A transmission line is, of course, a distributed parameter system, the dynamics of which are described by partial differential equations. However, such transmission lines have been approximated by a ladder network consisting of a large number of small, serially connected inductors to simulate the self inductance of the transmission line, with small capacitors connected from the connections between the inductors to ground to simulate the distributed capacitance between the transmission line and ground. Such networks have been denoted LC ladder oscillators because they have series inductance and shunt capacitance. In theory, a distributed parameter oscillatory system has an unlimited number of degrees of freedom, or standing wave frequencies which it can support, while the discrete component analog can support only a finite number of frequencies.

Standing waves on one and two-dimensional LC networks of capacitors and inductors with distributed nonlinearities have been analyzed by several investigators. It has been determined that several modes of oscillation can be excited simultaneously and asynchronously on a two-dimensional array composed of inductors and capacitors interconnected to form a grid, extending in at least two dimensions. In the one-dimensional LC ladder network such oscillations were determined to be unstable, and only a single mode of oscillation was observed. An oscillator which has several stable states of oscillation may be denoted a multistate oscillator, and an oscillator which is capable of oscillating in either individual oscillation modes or combinations of the oscillation modes may be denoted a multimode oscillator. Such oscillators may be passive, in that they consist only of passive linear elements such as capacitors and inductors, or they may be active and are capable of sustaining autonomous oscillations. It has been found that active LC ladder oscillators will support only one stable mode of autonomous oscillation, at the fundamental or lowest mode frequency of the oscillator.

SUMMARY OF THE INVENTION

I have invented a multimode and multistate oscillator which is capable of oscillating in several selectable modes, each at a different frequency, which are stable under certain conditions, and a frequency recognition device which utilizes the ladder oscillator. A passive oscillator in accordance with my invention is built with a ladder network composed of series capacitive impedances and shunt inductive impedances, and is capable of recognizing various freqencies which are at the mode frequencies of the oscillator. Each mode of oscillation is characterized by a unique standing wave pattern along the nodes of the ladder network, which allows detection of the mode of oscillation from the amplitudes or phase of the standing wave pattern without measuring the actual frequency of oscillation. The passive ladder oscillator will display the characteristic standing wave pattern if a mode frequency is close to the frequency of the signal which is being applied to the input terminals of the ladder network.

A ladder oscillator can be built to synchronize to an input signal frequency, and maintain autonomous oscillations at the nearest mode frequency after the input signal has been removed. This is accomplished by placing active nonlinear elements in parallel with the shunted passive elements of the ladder network. The mode of oscillation at which the ladder network is oscillating can be determined by examining the amplitude or phase at the nodes of the ladder oscillator or by finding the actual node or zero point of the standing wave form. For a stable oscillatory mode, the zeros or nodes of the standing wave form will not coincide with the actual nodes of the ladder network, but may be found by splitting the series elements of the ladder network to locate a virtual node of the standing wave form. The active ladder oscillator may be made to oscillate autonomously in any of its various modes by setting to zero the voltage at the virtual node in the ladder network which corresponds to a node of the standing wave pattern which is uniquely characteristic of the desired mode of oscillation.

Further objects, features, and advantages of my invention will be apparent from the following detailed description taken in conjunction with the accompanying drawings showing preferred embodiments of my invention.

DESCRIPTION OF THE PREFERRED EMBODIMENTS

Figure 1:
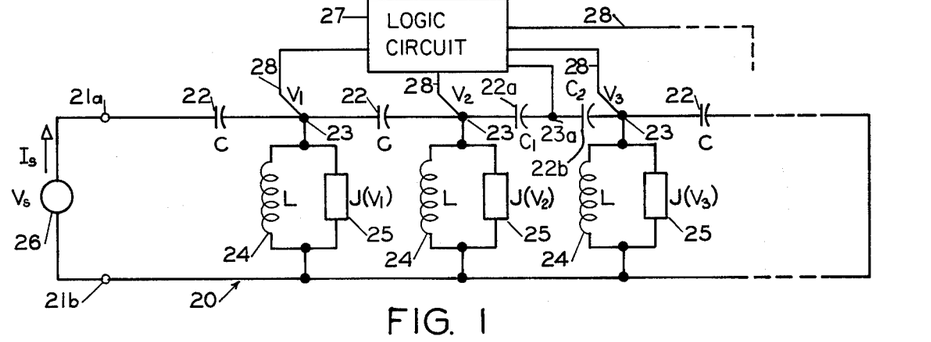
FIG. 1 is a schematic circuit diagram of a portion of a CL ladder oscillator utilized as a frequency recognition device, shown with an input signal source.

Referring now more particularly to the drawings, wherein like numerals refer to like parts throughout the several views, a preferred embodiment of my multimode and multistate ladder oscillator utilized as a frequency recognition device is shown generally at 20 in FIG. 1. The ladder oscillator 20 is called a CL ladder oscillator in that it has series capacitive impedances of capacitance value C and shunt inductive impedances of inductance value L. The ladder oscillator 20 has a pair of input terminals 21a and 21b and a series of serially connected capacitive impedances 22 with the first capacitive impedance in the series preferably being connected to the first input terminal 21a, and the last capacitive impedance in the series preferably being connected by a short circuit back to the second input terminal 21b. The dashed lines in FIG. 1 indicate that the series of capacitive impedances may be extended. Between each of the serially connected capacitors 22 is a node 23 of the ladder oscillator, as shown in FIG. 1, with the voltage at the ith node denoted as Vi. For the general case of a ladder oscillator having some number of oscillatory modes equal to a positive integer N, there would be $N + 1$ capactive impedances 22 connected in series, and some N nodes 23 of the ladder oscillator 20.

A shunt inductive impedance 24 is connected to each node 23 of the ladder oscillator and is also connected to the second input terminal 21b to form a ladder network as shown in FIG. 1. While only three sections and three nodes 23 are shown in FIG. 1, it is understood that the ladder oscillator 20 may have as many sections as desired by adding more series capacitive impedances and shunt inductive impedances to extend the ladder network. The inductive impedances 24 will have an inductance equal to some chosen value L. Active negative resistance devices 25 may also be connected in parallel with each inductive impedance 24, with the negative resistance devices 25 allowing for sustained and autonomous oscillations in the ladder oscillator 20 as described more fully below. However, my CL ladder oscillator 20 may be utilized for certain purposes without the necessity of having the nonlinear devices 25 present. For purposes of illustration, a source of input signals is shown generally at 26 in FIG. 1, connected up to the input terminals 21a and 21b of the ladder oscillator.

The ladder oscillator 20 is a passive network if the nonlinear devices 25 are replaced by an open circuit or, in effect, if the voltage-current function $J(v_i)$ of the device 25 is such that $J(v_i) = 0$. The passive ladder oscillator 20 has N natural frequencies or mode frequencies. The mode frequencies $\omega_n$ (at the nth node) are given by the following formula:

$$\omega_n = \frac{1}{2 \sqrt{LC} \sin\left[\frac{n\pi}{2(N+1)}\right]}$$

$$n = 1, 2, \ldots, N$$

I have determined that the voltages $v_i$ observed at the ith node of the ladder network are given by the expression below, where an input signal at a frequency $\omega_n$ is provided by the source 26:

$$v_i = V_i \sin \omega_n t$$

where $$V_i = A \sin\left(\frac{n\pi i}{N+1}\right)$$
$$i = 1, 2, \ldots, N$$

The amplitude A is determined by the magnitude of the input signals supplied by the input signal source 26. If the ladder oscillator 20 were perfectly lossless, the amplitude of oscillation would continue to build as long as the signal was applied. In a practical oscillator, the resistive losses associated with the passive elements will limit the amplitudes that are observed.

Figure 8:
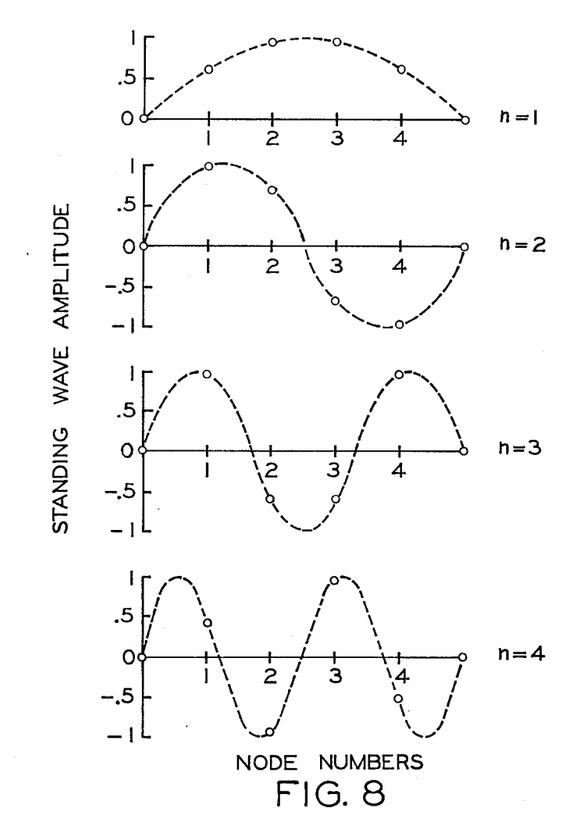
FIG. 8 is a graph showing the standing wave maximum amplitude patterns on a four-section CL ladder oscillator.

The maximum voltage amplitude $V_i$ is thus in the form of a standing wave which varies along the length of the ladder oscillator 20. An example of the standing wave pattern observed on a four mode CL ladder oscillator is shown in FIG. 8, wherein the input signal source 26 has been replaced by a short circuit after oscillations have been initiated. The graphs in FIG. 8 show the maximum relative amplitudes of the oscillating signal that is observed at the ith node $V_i$, with the frequency of oscillation at those nodes being determined by the mode of oscillation. The standing wave amplitudes do not actually go negative, but are indicated in FIG. 8 as such to show changes in phase of the oscillation at the nodes. For example, $n = 2$, the voltages at nodes 1 and 2 will always have the same sign, whereas the voltages at nodes 2 and 3 will always have opposite signs. The frequency of oscillation may thus be uniquely determined by measuring the amplitude and phase of the standing wave voltage pattern observed at the nodes 23 of the ladder oscillator. This may be done for the standing wave pattern as shown in FIG. 8, by comparing the signs of the voltages at nodes 1 and 2 and at nodes 2 and 3. For example, as shown in FIG. 1, a logic circuit 27 may be connected to the nodes 23 by conductors 28 to provide a means for comparing the relative phases of the voltages at the nodes. If the voltages at the two nodes being compared have the same sign, the logic circuit 27 could be constructed to register a 0, and if the two node voltages have opposite signs, the circuit could register a 1. Thus, the first or fundamental mode would register 00, the second mode 01, the third mode 10, and the fourth mode 11. This information may be displayed to a user or utilized for any other desired purpose. It is apparent that such a logic circuit could be provided by standard design procedures for an oscillator having any number of modes.

Figure 4:
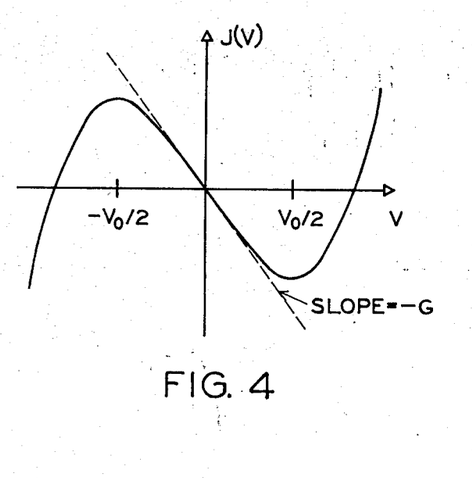
FIG. 4 is a graph of the VI characteristic of an active nonlinear device which may be utilized to sustain autonomous oscillations in the ladder oscillators shown in FIGS. 1 and 3.

Sustained autonomous oscillations may be obtained with the ladder oscillator 20 without need for an input signal source if there are active nonlinear devices 25 connected in parallel with the inductive impedances 24, as shown in FIG. 1. If the nonlinear device 25 has a nonlinear voltage-current (VI) function $J(v_i)$ which is sufficiently small compared with the impedance of the inductive impedance 24, the solution for the linear ladder oscillator provides a good approximation to the nonlinear case. $J(v_i)$ is the current through the device 25 when the voltage across the device is equal to $v_i$. A typical nonlinear function $j(v)$ that has been found suitable for use in the ladder oscillator 20 is shown in graphical form in FIG. 4. The function shown in FIG. 4 is approximately described by the following equation:

$$J(v) = -G(v - \frac{4}{3V_o^2}v^3)$$

where $G$ is a small conductance and $V_o$ is a chosen constant.

The nonlinear function given in the equation above is primarily chosen because it allows the ladder oscillator 20 to be described in terms of Van der Pol's equation, a non-linear equation whose properties have been thoroughly studied. However, any other suitable active nonlinear device could be used which has a portion of its VI characteristic having a negative slope passing through the origin or which is otherwise capable of sustaining oscillations. The nonlinear device 25 should generally be capable of supplying power to the oscillator during a portion of the oscillatory cycle, and withdrawing power from the oscillator during another portion of the oscillatory cycle. I have determined that the modes of oscillation of the ladder oscillator 20 with the active nonlinear devices 25 present, are very similar to the modes of oscillation of the passive ladder oscillator. For the equation for $J(v_i)$ given above, used as the nonlinear function, and where the conductance G is small compared to the impedance of the inductive impedance 24, the voltage $v_i$ at the ith node is given by:

$$v_i = V_i \sin \omega_n t$$

where $$V_i = A \sin\left(\frac{n\pi i}{N+1}\right) \quad \begin{array}{l} i = 1, 2, \ldots, N \\ n = 1, 2, \ldots, N \end{array}$$

and where $$A = \left[\begin{array}{l} \frac{2}{3}V_o \text{ for } \frac{n}{N+1} \neq \frac{1}{2} \\ V_o \text{ for } \frac{n}{N+1} = \frac{1}{2} \end{array}\right]$$

Thus the pattern of the voltages at the nodes of the active ladder oscillator 20 will be very similar to the pattern of the voltages observed at the nodes of the passive ladder oscillator. The active ladder oscillator will, however, have a definite maximum amplitude when oscillating autonomously. In each case the voltages at the nodes along the ladder oscillator will exhibit a standing wave pattern, with the pattern being unique for each mode of oscillation. The mode frequencies $$\omega_n = \frac{1}{2\sqrt{LC}\sin\left[\frac{n\pi}{2(N+1)}\right]} \quad n = 1, 2, \ldots, N$$

are the same as those given above for the passive CL ladder oscillator.

The ladder oscillator 20 can be used, either passively or with the active nonlinear devices 25, to determine if certain selected frequencies are present in the input signal supplied by the input signal source 26. Frequencies in the input signal which are substantially equal to one of the N mode frequencies will excite the passive ladder oscillator to display substantially the standing wave pattern of the mode that is nearest to that frequency. Generally, the frequencies in the input signal to a lossless passive oscillator must be quite close to the mode or resonant frequencies of the oscillator to ensure that the standing wave patterns will be observed. However, all realizable oscillators will have some resistive losses associated with the inductive and capacitive impedances, which will broaden the range of the resonances of the oscillator. The characteristic standing wave patterns will still be observed on a passive ladder oscillator having resistive losses, but only if the losses are kept relatively small. Since resistive losses build up with the number of sections and modes, large losses in the passive elements will limit the number of modes which can be obtained.

Figure 9:
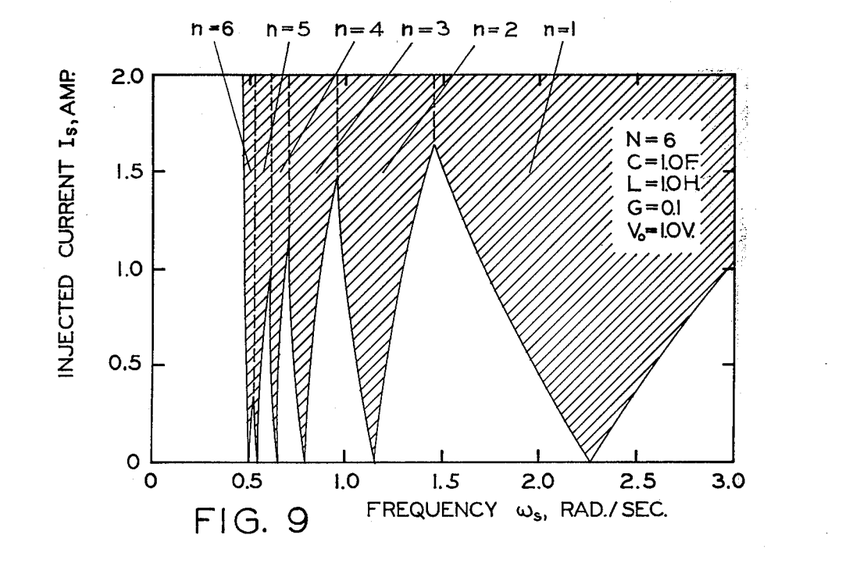
FIG. 9 is a graph showing the synchronization regions of a six-section CL ladder oscillator having the component value shown in the graph.

In order to provide frequency memory after the input signal from the input source has been removed, and to provide a broader range of frequencies which the ladder oscillator can synchronize to, it is necessary to utilize the active nonlinear devices 25 with the ladder oscillator. In addition, the device 25 can compensate for any resistive losses associated with the passive elements. In the absence of an input signal from the source 26, I have found that the active ladder oscillator 20 will build up oscillations in its fundamental mode, i.e. the fundamental mode being when $n=1$. However, the active ladder oscillator 20 will be forced to oscillate at the frequency of the input signal from the source 26 as long as the input signal is present. When the input signal is removed, the oscillator 20 will continue to oscillate at the mode frequency which generally is closest to the input frequency. The active ladder oscillator 20 is capable of being excited by an input signal even if the input signal is not exactly at the mode frequency. FIG. 9 shows the input signal "synchronization" regions between the dashed lines, for a ladder oscillator having N=6, and demonstrates that the ability of the ladder oscillator 20 to be synchronized to an input signal is dependent upon both the frequency of the input signal and the magnitude of the signal current $I_s$. With an input signal impressed on the oscillator which is within one of the synchronization regions shown in FIG. 9, the oscillator will maintain oscillation at the mode frequency which corresponds to the synchronization region after the input signal is removed. Thus, the active ladder oscillator 20 is capable of "remembering" that the frequency impressed upon it was within a certain range of frequencies. The input signal need only be impressed upon the ladder oscillator 20 for a period of time equal to N periods of the input signal frequency. Such a length of time is sufficient to permit the signal to travel to the end of the ladder, be reflected and return to the source. Once a mode of oscillation has been established, it persists until another frequency is injected or the power is turned off.

If several frequencies are present in the input signal, and if these frequencies are within the synchronization regions as shown in FIG. 9, the oscillator 20 will be forced to exhibit multimode oscillations containing each of the input signal frequencies. When the input signal is removed, the active oscillator 20 will continue to oscillate, but only at the highest mode frequency (lowest mode number) which is excited by one of the input signal frequencies.

The mode in which the ladder oscillator 20 is oscillating may be determined from the characteristic standing wave patterns at the nodes 23 of the oscillator as illustrated above. An example of such a standing wave pattern for a four section CL ladder oscillator is shown in FIG. 8. For a three section CL ladder oscillator, a node or zero of the standing wave pattern for the n=2 mode will occur at one of the nodes 23 of the ladder oscillator. I have found that for the three section ladder oscillator and for any N section ladder oscillator where the number $N + 1$ is not a prime number, the ladder oscillator will support modes of oscillation wherein the standing wave pattern has a node thereof coinciding with at least one real node of the ladder oscillator. In these cases, the active ladder oscillator can support autonomous multi-mode oscillations, that is, more than one frequency of oscillation can exist simultaneously at the nodes of the ladder oscillator. This result has been experimentally observed. Such multi-mode oscillations may be avoided by choosing the number of sections N such that the number $N + 1$ is a prime number. In such a case the nodes of the standing wave pattern cannot coincide with the real nodes of the ladder oscillator, and all the modes of these oscillators are stable.

It may be noted that the zeros or nodes of the standing wave pattern are unique for each mode of oscillation, and thus the particular mode of oscillation could be determined if the nodes of the standing wave pattern could be located. As indicated above, it is desirable that these nodes of the standing wave pattern should not coincide with the nodes of the ladder oscillator in order to insure that the oscillation modes are stable. However, there may be considered to exist a virtual node whose location falls between the nodes $I$ and $I + 1$ of the ladder structure. By replacing the capacitive impedance 22, of the capacitance value C, between these nodes by a series combination of two capacitors of capacitance $C_1$ and $C_2$, as shown by serially connected capacitors 22a and 22b respectively in FIG. 1, where $$C_1 = C \left(1 - \frac{V_i}{V_i+1}\right)$$

$$C_2 = C \left(1 - \frac{V_i+1}{V_i}\right)$$

and $V_i$ and $V_i+1$ are given by the values for the maximum amplitudes of the standing wave pattern as given above, the virtual node of the standing wave pattern can be made physically accessible at the connection 23a between the pair of capacitors. Since there are N possible modes of oscillation, it is possible to detect the N modes of oscillation by splitting up $N-1$ of the capacitive impedances 22 such that each capacitive impedance is split up in precisely the relationship necessary to detect one and only one of the N modes other than the fundamental mode. The fundamental mode, where $n=1$, does not have zeros or nodes of its standing wave pattern between the ends of the ladder oscillator 20. The connection 23a between the pairs of capacitors may be connected up by a conductor 28 to a logic circuit 27 which will automatically detect which of the virtual nodes of the standing wave patterns is substantially at or near zero voltage, and thus will be able to unambiguously determine which of the various modes of oscillation the ladder oscillator is in. The connection between a particular pair of capacitors will thus be at zero voltage if the frequency of the input signal is substantially equal to the mode frequency which has a node of its standing wave pattern between that particular pair of capacitors. If the oscillator is in its fundamental mode, none of the virtual nodes will be at zero voltage.

It is also possible to use the active ladder oscillator 20 as a frequency generator by locating the desired virtual node of the standing wave pattern at the connection between the appropriate pair of capacitors, and setting the voltage at that point to zero, as by providing an electrical connection to the second terminal 21b. Oscillations will build up and be maintained autonomously at the corresponding mode frequency. If no virtual node is set to zero, the oscillator will oscillate in its fundamental mode. Since an autonomous ladder oscillator would not require an input signal to initiate oscillations, the input signal source 26 is not present and a short circuit connection is provided between the terminals 21a and 21b. The oscillating voltage may be picked off of any of the real nodes 23 of the oscillator.

Figure 2:
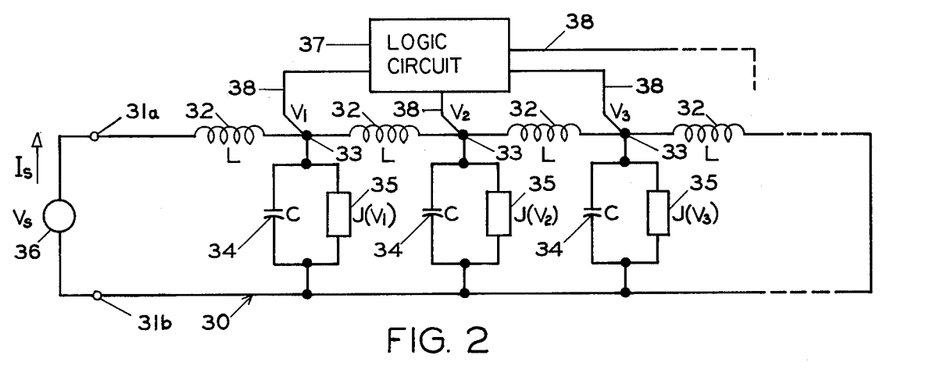
FIG. 2 is a schematic circuit diagram of a portion of an LC ladder oscillator utilized as a frequency recognition device, shown with an input signal source.

The results described above for the CL ladder oscillator 20 do not entirely hold for the case of the known LC ladder oscillator, as shown generally at 30 in FIG. 2. The LC ladder oscillator 30 has a pair of input terminals 31a and 31b, and a series of serially connected inductive impedances 32, with the first inductive impedance in the series connected to the first input terminal 31a, and the last inductive impedance 32 in the series being connected by a short circuit back to the second input terminal 31b. Between each of the serially connected inductors 32 is a node 33, with the voltage at the ith node being denoted as $V_i$. For the general case of an LC ladder oscillator having N resonances or oscillatory modes, there will be $N+1$ inductive impedances 32 connected in series, and some N nodes 33 of the ladder oscillator. A shunt capacitive impedance 34 is connected to each node 33 of the ladder oscillator 30, and is also connected to the second input terminal 31b to form a ladder network. The capacitive impedances 34 will each have a capacitance equal to some chosen value C. Active nonlinear devices 35, which are similar to the nonlinear devices 25 of the ladder oscillator 20, are connected in parallel with the capacitive impedances 34. A source of input signals is shown generally at 36 in FIG. 2, connected up to the input terminals 31a and 31b.

I have determined that the passive LC ladder oscillator 30, with the VI function $J(V_i)$ being equal to 0, will have the same standing wave pattern of voltage amplitudes at the nodes 33 of the ladder oscillator 30 as was given above for the passive CL ladder oscillator 20. The mode frequencies for the LC ladder oscillator are $$\omega_n = \frac{2}{\sqrt{LC}} \sin\left[\frac{n\pi}{2(N+1)}\right] \quad n = 1, 2, \ldots, N$$

Thus, the frequency of oscillation of the passive LC ladder oscillator 30 may be determined in the same manner as described above for the CL ladder oscillator 20. For example, a logic circuit 37 could be connected by conductors 38 to the nodes 33 of the LC ladder oscillator. The logic circuit 37 could detect the mode of oscillation by comparing the relative phases of the voltages at the nodes as described for the logic circuit 27.

It has been known that the LC ladder oscillator 30 with the nonlinear active devices 35 present will apparently not support autonomous oscillations except in the fundamental mode. Thus, the active LC ladder oscillator is not considered useful for frequency recognition in the manner outlined above for my active CL ladder oscillator 20. The ability of active CL ladder oscillators to maintain stable oscillations at modes other than the fundamental mode was an unexpected result in view of the results obtained for LC ladder oscillators.

The CL ladder oscillators described above are somewhat idealized in the sense that they do not take into consideration the resistive losses in the inductor and the leakage resistance through the capacitors. However, I have determined that the results given above also apply to a lossy CL ladder oscillator if certain conditions are met. A CL ladder oscillator with resistive losses taken into consideration is shown generally at 40 in FIG. 3. The lossy CL ladder oscillator 40 has input terminals 41a and 41b, and serially connected capacitive impedances 42, each having a small conductance 43 of value $G_1$ in parallel therewith, with the serially connected capacitive impedances and parallel conductances being connected at one end of the series to the input terminals 41a and at the other end by a short circuit to the other input terminals 41b. For a ladder network having N modes there will be $N + 1$ capacitive impedances 42 and some N nodes 44 between the capacitive impedances. A shunt inductive impedance 45 with a small resistance 46 of value $R_1$ is connected in shunt from each of the nodes 44 back to the other input terminal 41b of the ladder oscillator. The conductance 43 allows for the presence of any leakage current through the capacitive impedances 42, and the resistance 46 takes into consideration the small finite internal resistance of the inductive impedance 45. As indicated above, in order to sustain autonomous oscillation in the ladder oscillator it is necessary to have an active non-linear device 47 connected in parallel with each of the inductive impedances 45 and their internal resistance 46.

Figure 3:
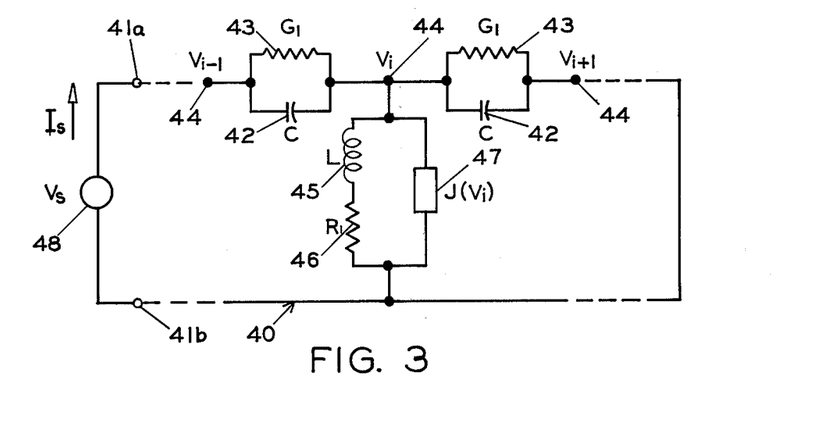
FIG. 3 is a schematic circuit diagram of a portion of a CL ladder oscillator having resistive losses, shown with an input signal source.

Provided that the resistance 46 and the conductance 43 have small values, the oscillatory modes of the ladder oscillator 40 are very nearly the same as the modes of the ladder oscillator 20. There will be a slight variation in the amplitudes of the autonomous oscillations of the ladder oscillator 40, with slightly decreasing amplitudes being experienced as the mode number n increases. I have also determined that the nonlinear active device 47 must have certain characteristics in order that autonomous oscillation shall be sustained. For example, using the VI characteristic $J(V_i)$ for the nonlinear device 47 as given above with reference to the CL ladder oscillator 20, it is necessary that the conductance G of the characteristic $J(V_i)$ satisfy the following relationship:

$$G > 4 \left( \frac{R_1 C}{L} + G_1 \right)$$

If this condition is satisfied, the active ladder oscillator 40 will exhibit the standing wave modes of oscillation described above for the active ladder oscillator 20, and can be used for the same purposes. Since in the practical case, the conductance 43 and the resistance 46 can indeed be made very small, the results obtained for the idealized ladder oscillator 20 should generally hold true.

Figure 5:
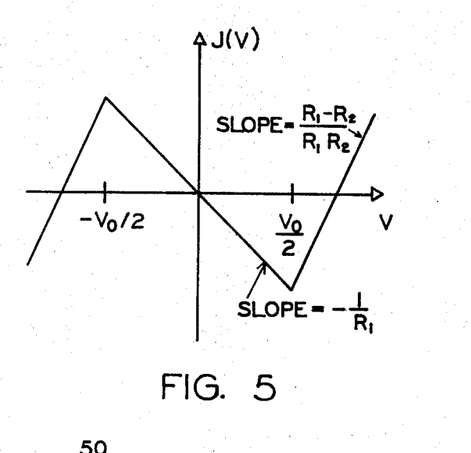
FIG. 5 is a piece-wise linear approximation of the nonlinear characteristic of FIG. 4.
Figure 6:
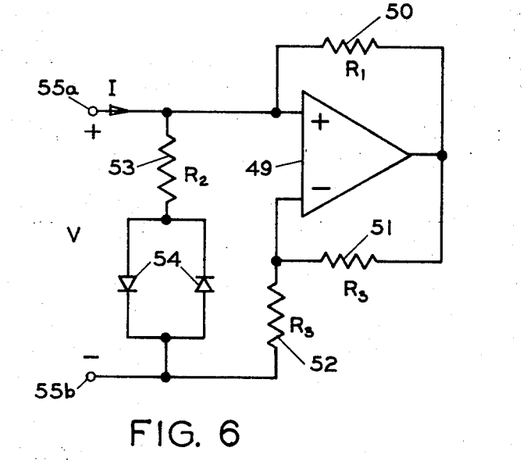
FIG. 6 is a schematic circuit diagram of an electrical circuit which provides the VI characteristic shown in FIG. 5.

Various nonlinear devices and networks that provide nonlinear voltage-current (VI) characteristics can be utilized to provide the nonlinear function $J(v)$. For example, a tunnel diode combined with a voltage source or sources could provide an approximation to the characteristics shown in FIG. 4. The voltage-current characteristic shown in FIG. 5 provides a piecewise linear approximation of the VI characteristic of FIG. 4, while the circuit shown in FIG. 6 can be utilized to mechanize this piece-wise linear function. The circuit shown in FIG. 6 has a high-gain amplifier 49 with a feedback resistor 50 of a desired value $R_1$, which feeds back the output of the amplifier 49 to the positive or noninverting input of the amplifier. The output of the amplifier 49 is also fed back to the negative or inverting input of the amplifier through a voltage divider composed of a resistor 51 and a resistor 52 both of which are of some chosen value $R_3$. A resistor 53 of value $R_2$, and parallel connected oppositely poled diodes 54, are serially connected between the input terminals 55a and 55b of the circuit. As shown in FIG. 5, a voltage V at the input to the circuit of FIG. 5 will produce a current with a negative slope relationship of $-1/R_1$ up to a voltage value of $V_o/2$, and for voltages larger than that, the slope of the VI characteristic will be equal to $(R_1 - R_2)/R_1 R_2$. The voltage $V_o$ is determined by the characteristics of the diodes 54.

Figure 7:
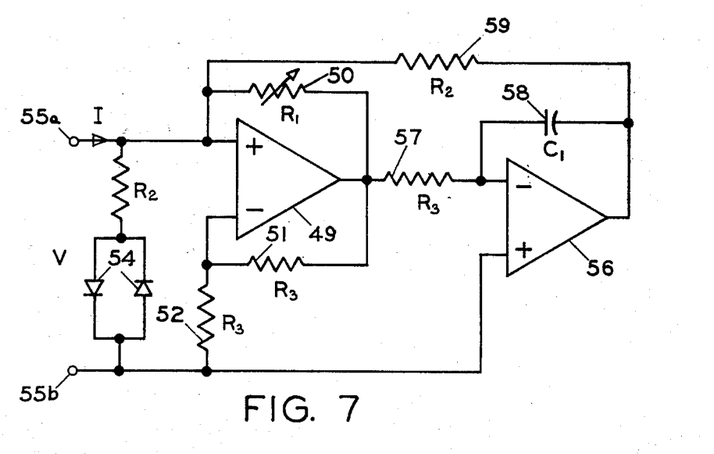
FIG. 7 is a schematic circuit diagram of a simulated inductor in parallel with the nonlinear device of FIG. 6.

For purposes of mechanization of the entire CL ladder oscillator 20, it may be desirable to mechanize the inductive impedances 24 without the use of actual inductors. This may be desirable, for example, where integrated circuits are being used to mechanize the oscillator and coil type inductances are not feasible. A circuit which can be utilized to mechanize the nonlinear VI characteristics shown in FIG. 5 and the parallel inductive impedance 24, is shown in FIG. 7. The circuit of FIG. 7 is basically the circuit of FIG. 6 with the use of another high-gain amplifier 56 with associated components connected with it to form a gyrator which provides the apparent characteristic of an inductor. The high-gain amplifier 56 receives the output of the amplifier 49 through a resistor 57 of value $R_3$ to the negative or inverting input of the amplifier 56. The positive or noninverting input of the amplifier 56 is connected directly to the input terminal 55b. The output of the amplifier 56 is fed back to its negative input through a capacitor 58 of capacitance value $C_2$. The output of the amplifier 56 is also fed back through a resistor 59 of value $R_2$ to the positive input of the amplifier 49. The frequency characteristics of the capacitor 58 are, in effect, inverted to provide the frequency characteristics of an inductor by the circuit of FIG. 7. One of the primary advantages of the CL oscillator is that the shunt impedances connected between the nodes of the ladder oscillator to the low or ground side of the ladder are easily mechanized using such gyrator circuits as the one shown in FIG. 7. Although the inductive impedances of an LC ladder oscillator may also be mechanized utilizing gyrators, the known circuitry to accomplish this is much more complex. Thus CL ladder oscillators are especially adapted for mechanization with integrated circuitry.

The CL ladder oscillator 20 described above utilized $N + 1$ capacitive impedances 22 in series, with the first capacitive impedance in the series connected to the input signal source 26, and the last capacitive impedance short circuit connected to the input terminal 21b. However, the standing wave voltage patterns described above will continue to be observed if the last capacitive impedance 22 in the series is removed leaving the Nth node 23 at the end of the ladder network. Only N series capacitors would thus be required. The first capacitive impedance in the series may also be eliminated and replaced by a short circuit, leaving $n-1$ capacitive impedances in series. For such a ladder oscillator, the input signal source 26, connected directed to the first node 23, would preferably approximate a current source having a high source impedance.

The ladder oscillators described above utilize inductive impedances and capacitive impedances of uniform value throughout the ladder oscillator. Thus, the only possible frequencies of oscillation are some function of the values of the uniform inductive impedances and capacitive impedances. However, the two N different natural frequencies of standing waves on a 2N section symmetrical, but non-uniform, CL ladder oscillator can be arbitrarily chosen. Thus, a ladder network can be designed using standard network synthesis procedures which will provide any number of arbitrarily chosen natural frequencies. For the case of nonuniform inductive and capacitive impedance values through the ladder structure, standing waves will be observed at the nodes of the CL ladder network but will not follow the maximum amplitude distribution as given above for a ladder network having uniform or substantially uniform capacitive and inductive impedances. By standard network analysis procedures, the expected standing wave maximum voltages at the nodes of the nonuniform CL ladder oscillator may be calculated, and thus the nonuniform ladder oscillator may be utilized for frequency recognition in a manner similar to that described above for the uniform ladder oscillator. I have also observed that the results obtained for the uniform ladder networks are not highly sensitive to the variations in component values, with variations as great as 5 to 10 percent easily tolerated without substantially changing the standing wave patterns that are observed along the ladder network.

It is understood that my invention is not confined to the particular construction and arrangement of parts herein illustrated and described; but embraces all such modified forms thereof as may come within the scope of the following claims.

I claim:

1. A ladder oscillator frequency recognition device capable of recognizing a chosen positive integer number N selected input signal frequencies impressed thereon, comprising:
   a. at least $n-1$ serially connected capacitive impedances;
   b. N inductive impedances connected in shunt with said series capacitive impedances to form a ladder network with a node of the ladder network at each connection between said capacitive and inductive impedances;
   c. said inductive and capacitive impedances being adapted to produce N oscillation modes in response to an input signal impressed on the ladder network, each oscillation mode being at a different frequency and having a unique maximum amplitude standing wave pattern at said nodes of the ladder network, the frequency of the input signal being determinable from the amplitude and phase of the standing wave pattern at said nodes of the ladder network if the frequency of the input signal is substantially equal to one of the N mode frequencies of the ladder network; and
   d. means for comparing the signs of the voltages at said nodes of the ladder network to determine which mode the ladder network is oscillating in.

2. The ladder oscillator frequency recognition device as specified in claim 1 wherein said capacitive impedances are each substantially equal in capacitance and wherein said inductive impedances are each substantially equal in inductance.

3. The ladder oscillator frequency recognition device as specified in claim 1 including N active nonlinear means each connected in parallel with one of said inductive impedances for producing sustained oscillations at each of said N oscillation modes of the ladder network.

4. The ladder oscillator frequency recognition device as specified in claim 1 wherein $N + 1$ is a prime number.

5. The ladder oscillator frequency recognition device as specified in claim 1 wherein $N - 1$ of said capacitive impedances include a pair of serially connected capacitors, and wherein the values of the capacitance of each of the capacitors in said pairs of capacitors are selected such that a node of the standing wave pattern of one of the $N - 1$ modes of the ladder oscillator other than the fundamental mode will occur at the connection between each of said pairs of capacitors, the frequency of the input signal being determinable from the particular pair of capacitors between which a node of the standing wave pattern occurs if the frequency of the input signal is substantially equal to one of said $N - 1$ mode frequencies of the ladder network, and including means for detecting a voltage node between said pairs of capacitors to determine which mode the ladder network is oscillating in.

6. The ladder oscillator frequency recognition device as specified in claim 1 wherein said inductive impedances include an active gyrator.

7. An active ladder oscillator capable of being excited at a chosen positive integer number N selected frequencies by an input signal impressed thereon from an input signal source, comprising:
   a. a pair of input terminals adapted to be connected to the input signal source;
   b. at least $N-1$ serially connected capacitive impedances which are connected at one end of the series to a first of said input terminals;
   c. N inductive impedances each connected in shunt between said series capacitive impedances and a second of said input terminals to form a ladder network with a node of the ladder network at each connection between said capacitive and inductive impedances, said capacitive and inductive impedances being adapted to produce N oscillation modes, each oscillation mode being at a different frequency and having a unique standing wave pattern at the nodes of the ladder network; and
   d. N active nonlinear means each connected in parallel with one of said inductive impedances for producing sustained oscillations at each of said N oscillation modes of the ladder oscillator, the mode at which said ladder oscillator oscillates after removal of the input signal being dependent on the frequency and magnitude of the input signal.

8. The ladder oscillator as specified in claim 7 wherein said capacitive impedances are each substantially equal in capacitance, and wherein said inductive impedances are each substantially equal in inductance.

9. The ladder oscillator as specified in claim 7 including means for comparing the signs of the voltages at said nodes of the ladder network to determine which mode the ladder oscillator is oscillating in.

10. The ladder oscillator as specified in claim 7 wherein $N + 1$ is a prime number.

11. The ladder oscillator as specified in claim 7 wherein $N - 1$ of said capacitive impedances include a pair of serially connected capacitors and wherein the values of the capacitance of each of the capacitors in said pairs of capacitors are selected such that a node of the standing wave pattern of one of the $N - 1$ modes of the ladder oscillator other than the fundamental mode will occur at the connection between each of said pairs of capcitors, the frequency of the mode of oscillation being determinable from the particular pair of capacitors between which a node of the standing wave pattern occurs.

12. An active ladder oscillator capable of producing a chosen positive integer number N selected frequencies of autonomous oscillations, comprising:
   a. a pair of terminals;
   b. at least $N-1$ serially connected capacitive impedances which are connected at one end of the series to a first of said terminals;
   c. N inductive impedances each connected in shunt between said series capacitive impedances and a second of said terminals to form a ladder network with a node of the ladder network at each connection between said capacitive and inductive impedances, said capacitive and inductive impedances being adapted to produce N oscillation modes, each oscillation mode being at a different frequency and having a unique standing wave pattern at said nodes of the ladder network;
   d. N active nonlinear means each connected in parallel with one of said inductive impedances for producing sustained oscillations at each of said N oscillation modes; and
   e. $N-1$ of said capacitive impedances including a pair of serially connected capacitors, the values of the capacitance of each of the capacitors in said pairs of capacitors being selected such that a node of the standing wave pattern of one of the $N-1$ modes of the ladder oscillator other than the fundamental mode will occur at the connection between each of said pairs of capacitors, the ladder oscillator providing autonomous oscillations in a chosen one of its $N-1$ modes other than the fundamental mode when the connection between the particular pair of capacitors corresponding to a node of the standing wave pattern of the chosen mode is electrically connected to said second terminal and said terminals are connected together by a short circuit connection.

* * * * *